(12) United States Patent
Liu et al.

(10) Patent No.: US 9,263,551 B2
(45) Date of Patent: Feb. 16, 2016

(54) SIMULTANEOUS FORMATION OF SOURCE/DRAIN OPENINGS WITH DIFFERENT PROFILES

(71) Applicant: Taiwan Semiconductor Manufacturing Company, Ltd., Hsin-Chu (TW)

(72) Inventors: Eric Chih-Fang Liu, Taipei (TW);
Srisuda Thitinun, Amphur Muang (TH);
Dai-Lin Wu, Hsinchu (TW); Ryan Chia-Jen Chen, Chiayi (TW);
Chao-Cheng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/052,160

(22) Filed: Oct. 11, 2013

(65) Prior Publication Data
US 2015/0104913 A1  Apr. 16, 2015

(51) Int. Cl.
| | |
|---|---|
| *H01L 21/3205* | (2006.01) |
| *H01L 21/3213* | (2006.01) |
| *H01L 21/322* | (2006.01) |
| *H01L 29/66* | (2006.01) |
| *H01L 21/8238* | (2006.01) |
| *H01L 21/8234* | (2006.01) |
| *H01L 21/3065* | (2006.01) |
| *H01L 21/762* | (2006.01) |

(52) U.S. Cl.
CPC ...... *H01L 29/66636* (2013.01); *H01L 21/3065* (2013.01); *H01L 21/76254* (2013.01); *H01L 21/823412* (2013.01); *H01L 21/823418* (2013.01); *H01L 21/823807* (2013.01); *H01L 21/823821* (2013.01)

(58) Field of Classification Search
CPC ............... H01L 29/6656; H01L 21/823807;
H01L 21/3065; H01L 21/31116; H01L 21/30608; H01L 21/31138; H01L 21/30617
USPC ........... 257/192, E29.255, E21.19, E21.252;
438/585, 706, 229
See application file for complete search history.

(56) References Cited

U.S. PATENT DOCUMENTS

| | | | |
|---|---|---|---|
| 2009/0096002 A1* | 4/2009 | Yu et al. | 257/308 |
| 2010/0270605 A1* | 10/2010 | Choi et al. | 257/316 |
| 2012/0080723 A1* | 4/2012 | Lee et al. | 257/192 |

OTHER PUBLICATIONS

Burton et al. "Dry Etching for Microelectronics" Elsevier Science Ltd , ISBN:0444869050, 1984.*
Charavel et al. "Tuning of Etching Rate by Implantation: Silicon, Polysilicon and Oxide" AIP Conference Proceedings;vol. 866 Issue 1, p. 325 2006.*

* cited by examiner

*Primary Examiner* — Calvin Choi
*Assistant Examiner* — Xiaoming Liu
(74) *Attorney, Agent, or Firm* — Slater & Matsil, L.L.P.

(57) ABSTRACT

A method includes forming a first gate stack and a second gate stack over a first portion and a second portion, respectively, of a semiconductor substrate, masking the first portion of the semiconductor substrate, and with the first portion of the semiconductor substrate being masked, implanting the second portion of the semiconductor substrate with an etch-tuning element. The first portion and the second portion of the semiconductor substrate are etched simultaneously to form a first opening and a second opening, respectively, in the semiconductor substrate. The method further includes epitaxially growing a first semiconductor region in the first opening, and epitaxially growing a second semiconductor region in the second opening.

20 Claims, 11 Drawing Sheets

SIMULTANEOUS FORMATION OF SOURCE/DRAIN OPENINGS WITH DIFFERENT PROFILES

BACKGROUND

The reduction of the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in current flow between the source and drain when a sufficient voltage is applied to the gate of the MOS device.

To further enhance the performance of MOS devices, stress may be introduced in the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

A commonly used method for applying compressive stress to the channel regions of MOS devices includes growing stressors in the source and drain regions. Such a method typically includes the steps of forming a gate stack on a semiconductor substrate, forming gate spacers on sidewalls of the gate stack, forming recesses in the silicon substrate along the gate spacers, and epitaxially growing stressors in the recesses. Since the stressors have a lattice constant different from that of silicon, it expands and applies a stress to the channel region, which is located between a source stressor and a drain stressor.

The above-discussed method is affected by pattern-loading effects, which occur due to a difference in pattern densities. The pattern-loading effects pertain to a phenomenon occurring upon simultaneous etching of a semiconductor substrate in a region of a higher pattern density and a region of a lower pattern density. The profiles of the trenches are related to the density of patterns. Situation may occur that two types of devices have similar pattern densities, but their trench profiles are desirably to be significantly different from each other. Conventionally, if such situation occurs, two etching processes need to be performed, each used for forming the trenches of one type of device. Using this method, the trench profile of each of the devices may be tuned. The manufacturing cost, however, is high since two separate photolithography processes are needed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Transistors and the methods of forming the same are provided in accordance with various exemplary embodiments. The intermediate stages of forming the transistors are illustrated. The variations of the embodiments are discussed. Throughout the various views and illustrative embodiments, like reference numbers are used to designate like elements.

Figure 1:
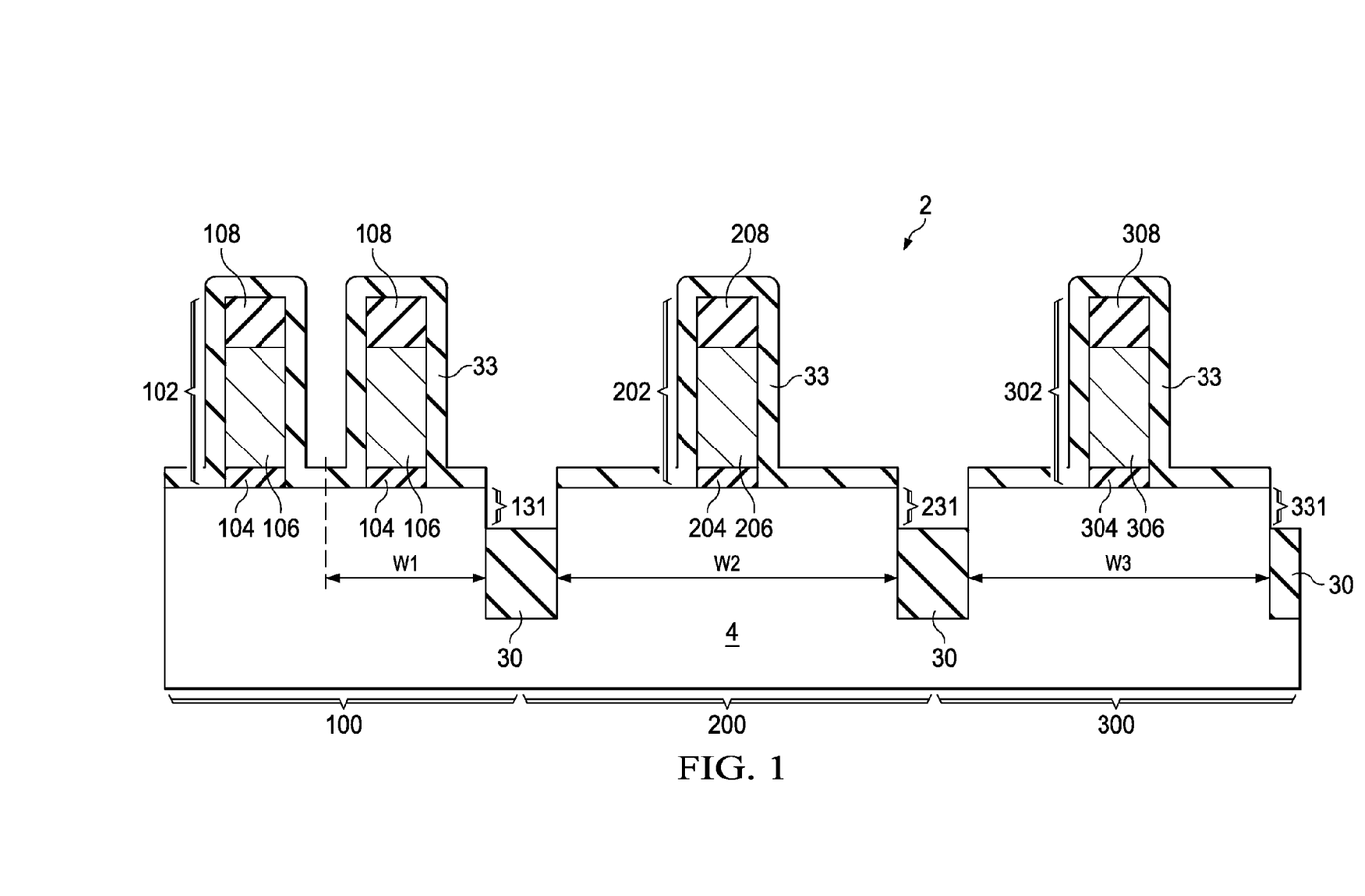
FIGS. 1 through 6 are cross-sectional views of intermediate stages in the manufacturing of transistors whose source/drain stressors have different trench profiles in accordance with some exemplary embodiments.

FIG. 1 illustrates substrate 4, which is a portion of wafer 2 that comprises a first portion in device region 100, a second portion in device region 200, and a third portion in device region 300. Device regions 100, 200, and 300 may have the same or different pattern densities. The sizes of exposed active regions in device regions 100, 200, and 300 may also be the same as or different from each other. For example, width W1 of the active region in device region 100 may be smaller than width W2 of the active region in device region 200 and width W3 of the active region in device region 300. Furthermore, width W2 may be equal, greater than, or smaller than width W3. In some embodiments, device region 100 is a Test Critical Dimension (region), which is formed to test the critical dimension of gate electrodes. Device region 100 may also be a Static Random Access Memory (SRAM) region, in which devices are densely placed. Device regions 200 and 300 may be logic device regions, which may be, for example, core circuit regions. Alternatively, device regions 200 and 300 are Input/output (I/O) circuit regions. Substrate 4 may be a bulk semiconductor substrate such as a silicon substrate, or may be a composite substrate such as a Silicon-On-Insulator (SOI) substrate.

Gate stacks 102 are formed in region 100 and over substrate 4. Gate stacks 102 include gate dielectrics 104 and gate electrodes 106. Gate stack 202 comprising gate dielectric 204 and gate electrode 206 is formed in device region 200 and over substrate 4. Gate stack 302 comprising gate dielectric 304 and gate electrode 306 is formed in device region 300 and over substrate 4. Gate dielectrics 104, 204, and 304 may comprise silicon oxide or a high-k material having a high k value, for example, higher than about 7.0. Gate electrodes 106, 206, and 306 include conductive materials such as doped polysilicon, metals, metal silicides, metal nitrides, and combinations thereof. Gate stacks 102, 202, and 302 may also include hard masks 108, 208, and 308, respectively, wherein hard masks 108, 208, and 308 may comprise silicon nitride, for example. Gate electrodes 106, 206, and 306 and gate dielectrics 104, 204, and 304 may act as dummy gates, which will be replaced with replacement gates in subsequent processes. Alternatively, gate electrodes 106, 206, and 306 and gate dielectrics 104, 204, and 304 may act as the gate stacks in the final transistors. Although not shown, there may be a plurality of gate electrodes 206 parallel to, and adjacent to, each other, with common sources and/or common drains formed between electrodes 206 using the subsequently discussed process. Similarly, there may be a plurality of gate electrodes 306 parallel to, and adjacent, to each other, with common sources and/or common drains formed between electrodes 306 using the subsequently discussed process. Furthermore, in these embodiments, the distance between neighboring gate electrodes 206 may be equal to, greater than, or smaller than, the distance between neighboring gate electrodes 306.

Isolation regions 30, which may be Shallow Trench Isolation (STI) regions, are formed to extend into semiconductor substrate 4. In some embodiments, Fin Field-Effect Transistors (FinFETs), as shown in FIGS. 1 through 10. In alternative embodiments, the transistors formed in accordance with the embodiments of the present disclosure are planar transistors. STI regions 30 may be used to separate device regions 100, 200, and 300. In the embodiments in which FinFETs are to be formed, the top surfaces of STI regions 30 are recessed, forming semiconductor fins 131, 231, and 331 over the top surfaces of STI regions 30.

In some embodiments, Lightly Doped Drain/source (LDD) regions (not shown) are formed, for example, by implanting a p-type impurity or an n-type impurity into substrate 4, depending on whether the transistors that are to be formed are p-type transistors or n-type transistors. Gate stacks 102, 202, and 302 act as an implantation mask so that the inner edges of the LDD regions are substantially aligned with the edges of gate stacks 102, 202, and 302. In addition, pocket regions (not shown) may also be formed, for example, by implanting an impurity that has the opposite conductivity types as the respective LDD regions.

After the formation of the LDD regions and/or pocket regions, gate spacer layer 33 is formed. Gate spacer layer 33 is formed as a conformal layer, and hence includes vertical portions on the sidewalls of gate stacks 102, 202, and 302, and horizontal portions covering gate stacks 102, 202, and 302 and substrate 4. In some embodiments, gate spacer layer 33 includes a silicon oxide layer (not shown) and a silicon nitride layer (not shown) over the silicon oxide layer. In alternative embodiments, gate spacer layer 33 includes one or more layers including silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

Figure 2:
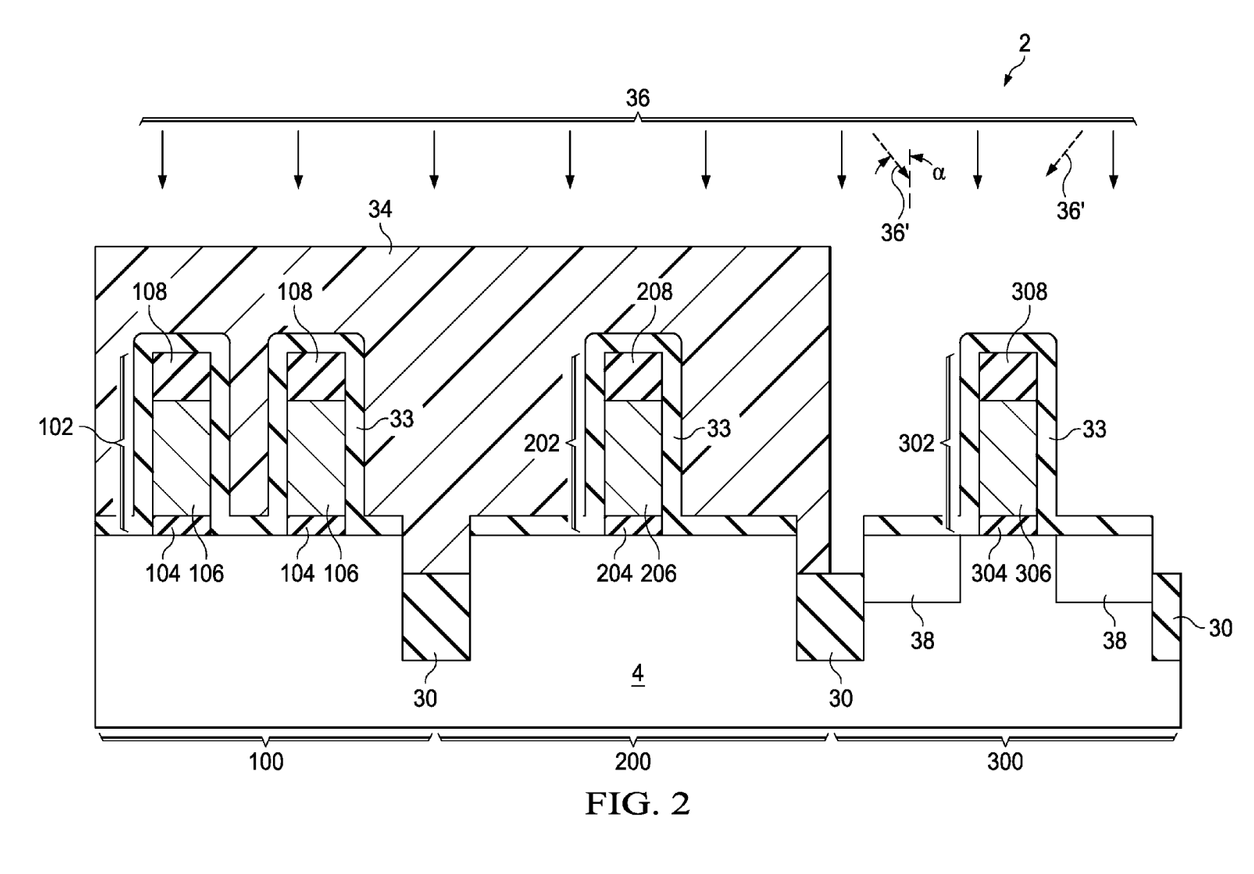

Referring to FIG. 2, photo resist 34 is formed to cover device regions 100 and 200, leaving device region 300 not covered. An implantation 36 is performed to implant the active region in device region 300 with an etch-retarding element, forming etch-retarding regions 38 in the portions of substrate 4. Implantation 36 may be vertical. Alternatively, implantation 36 may include tilt implantations (as symbolized by dashed arrows 36') tilting in opposite directions. The tilt angle α may be smaller than about 10 degrees in some embodiments, so that small portions of etch-retarding regions 38 are overlapped by the vertical portions of gate spacer layer 33. In some embodiments, the etch-retarding element comprises boron, phosphorous, arsenic, or the like. In some illustrated embodiments as shown in FIG. 2, boron is implanted.

Figure 3:
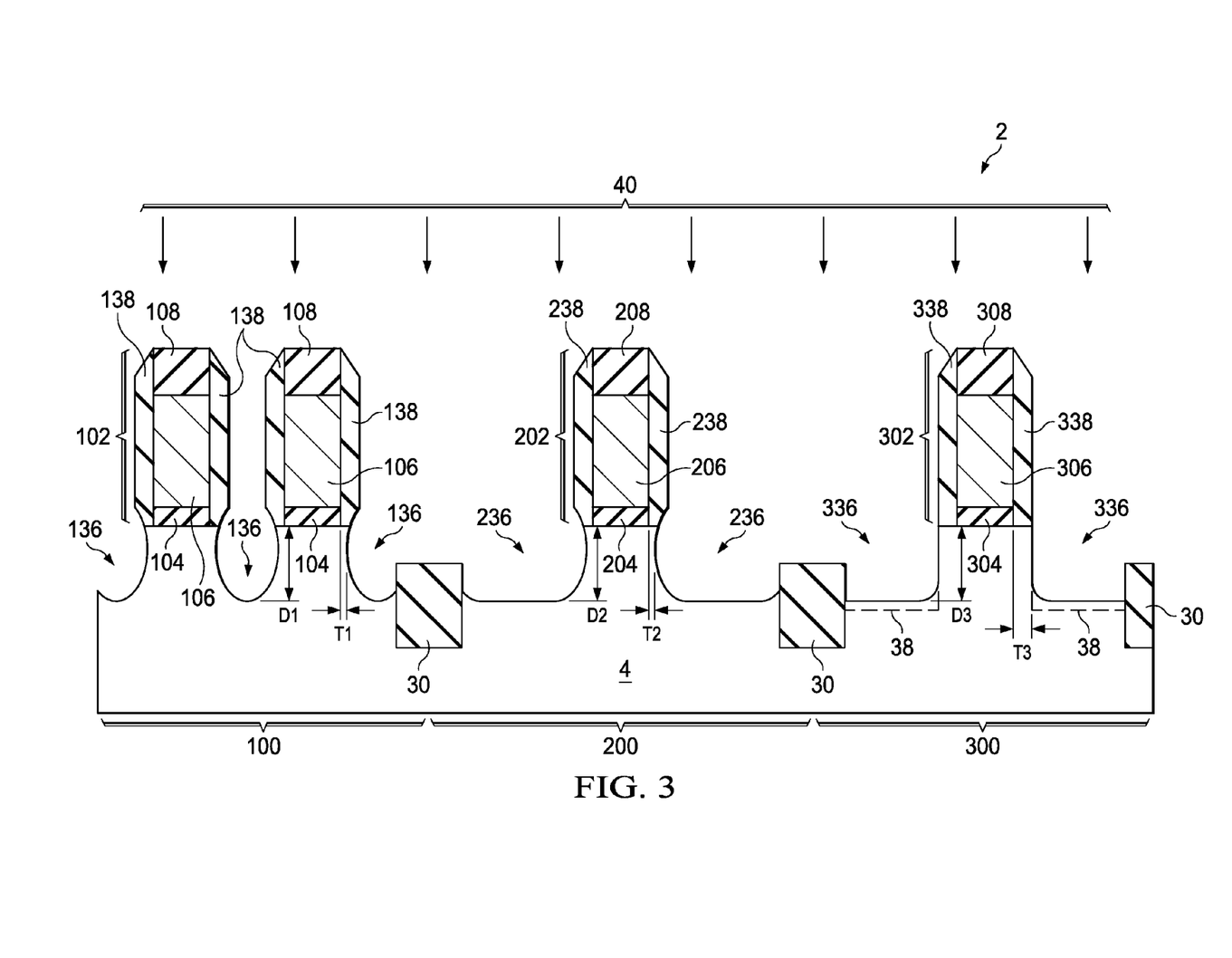

The dosage and the energy of the implantation are selected in accordance with the desirable profile of the resulting source/drain openings 336 (FIG. 3). In some exemplary embodiments, the dosage of the etch-retarding element is between about $1\times10^{12}/cm^2$ and about $1\times10^{16}/cm^2$. The implantation energy may be between about 0.1 keV and about 80 keV. It is appreciated, however, that the values recited throughout the description are merely examples, and may be changed to different values.

Photo resist 34 is removed after the implantation. Next, referring to FIG. 3, an etching (represented by arrows 40) is performed to form openings 136, 236, and 336 simultaneously in device regions 100, 200, and 300, respectively. In accordance with some embodiments, between the formation of etch-retarding regions 38 and the etching as shown in FIG. 3, no thermal process (for example, with temperatures higher than about 25° C. or about 50° C.) and dopant activation process is performed. The etching is performed using a dry etching method, wherein the etching gas may include $Cl_2$, $O_2$, $SF_6$, $CF_4$, $CHF_3$, $NF_3$, $Br_2$, HBr, $BCl_3$, HBr, or combinations thereof. Other gases such as Ar, $N_2$, He, and combinations thereof may also be added. The etching includes an isotropic component (effect) and an anisotropic component (effect). In some embodiments, the anisotropic component dominates the etching. Depth D1 of openings 136, depth D2 of openings 236, and D3 of openings 336 may be between about 150 Å and about 500 Å, for example. In the illustrated embodiments, the horizontal portions of gate spacer layer 33 (FIG. 2) are removed by the etching step, while the vertical portions remain to form gate spacers 138, 238, and 338. In alternative embodiments, the patterning of gate spacer layer 33 (FIG. 2) to form gate spacers 138, 238, and 338 is performed before the formation of etch-retarding regions 38.

As shown in FIG. 3, although openings 136, 236, and 336 are formed simultaneously, the profile of openings 336 is different from that of openings 136 and 236. For example, openings 336 extend less underlying gate spacers 338 than openings 236 (or openings 136) extend underlying gate spacers 238 (or 138). The gate proximities T1 and T2 are smaller than the gate proximity of T3, wherein gate proximity T1 is the lateral distance from openings 136 to the closest edge of gate stack 102, proximity T2 is the lateral distance from openings 236 to the closest edge of gate stack 202, and proximity T3 is the lateral distance from openings 336 to the closest edge of gate stack 302. In some embodiments, different (T3−T2) is greater than about 100 Å.

The difference in the profiles of openings 336 and 136/236 are partially resulted since the etch-retarding element affects the etching rate of etch-retarding regions 38. For example, the etching rate of the boron-doped etch-retarding regions 38 is lower than the etching rate of the un-implanted portions of substrate 4 in device regions 100 and 200. It is realized that the anisotropic effect is at least partially due to the bombardment to the exposed substrate 4, and hence the anisotropic component is not affected by the doping of boron. On the other hand, the isotropic component is affected by the doping of boron, and the isotropic etching rate of etch-retarding regions 38 is lower than the isotropic etching rate of the portions of substrate 4 not doped by boron. Hence, the lateral etching rate in etch-retarding regions 38 is reduced than the lateral etching rate of regions 100 and 200, and the vertical etching rate in etch-retarding regions 38 may not be significantly reduced than in regions 100 and 200. Gate proximity T3 is thus greater than gate proximities T1 and T2. In some exemplary embodiments, gate proximity T3 is equal to zero nanometer, and hence openings 336 have substantially vertical edges.

Figure 11:
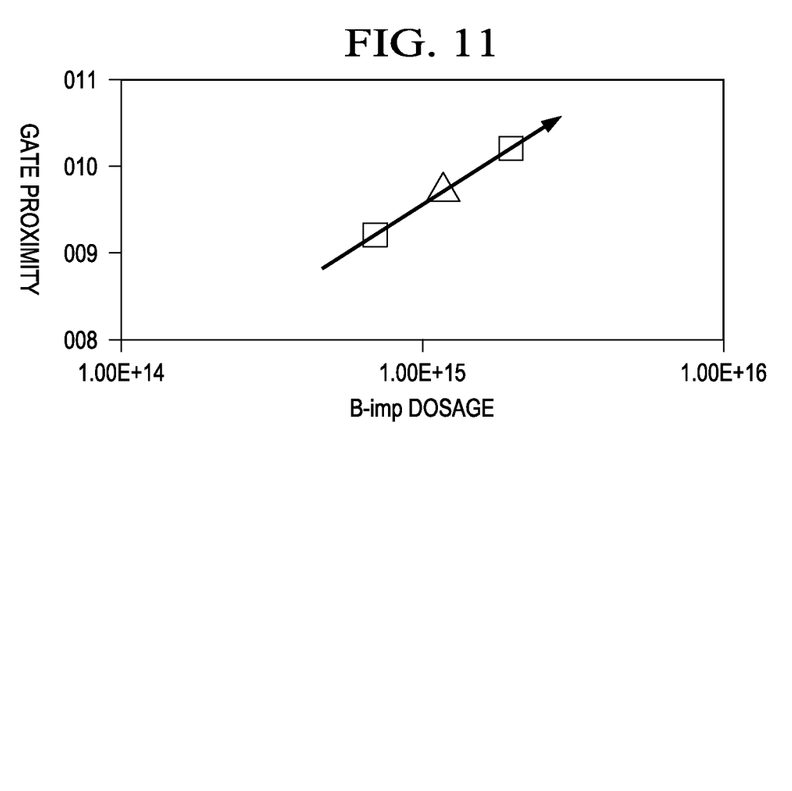
FIG. 11 illustrates the gate proximity of source/drain openings as a function of boron dosage.

The dosage, the implantation energy, the implanted species, and the implantation angle affect the profiles of the resulting openings 336. FIG. 11 illustrates the gate proximity T3 as a function of the dosage (B-Imp dosage) of the implanted boron. FIG. 11 reveals that with the increase in the boron dosage, the gate proximity T3 (also refer to FIG. 3) increases almost linearly in the illustrated range. Hence, the profiles of openings 336 may be adjusted through the adjustment of the implantation energy, the implanted species, and the implantation angle.

In some embodiments, as a result of the formation of openings 336, etch-retarding regions 38 are essentially removed, and hence substantially no etch-retarding element is left in device region 300. In alternative embodiments, after the formation of openings 336, there are some residue parts of the etch-retarding element left at the bottoms and/or the sidewalls of trenches 336, as illustrated by dashed lines.

Figure 4:
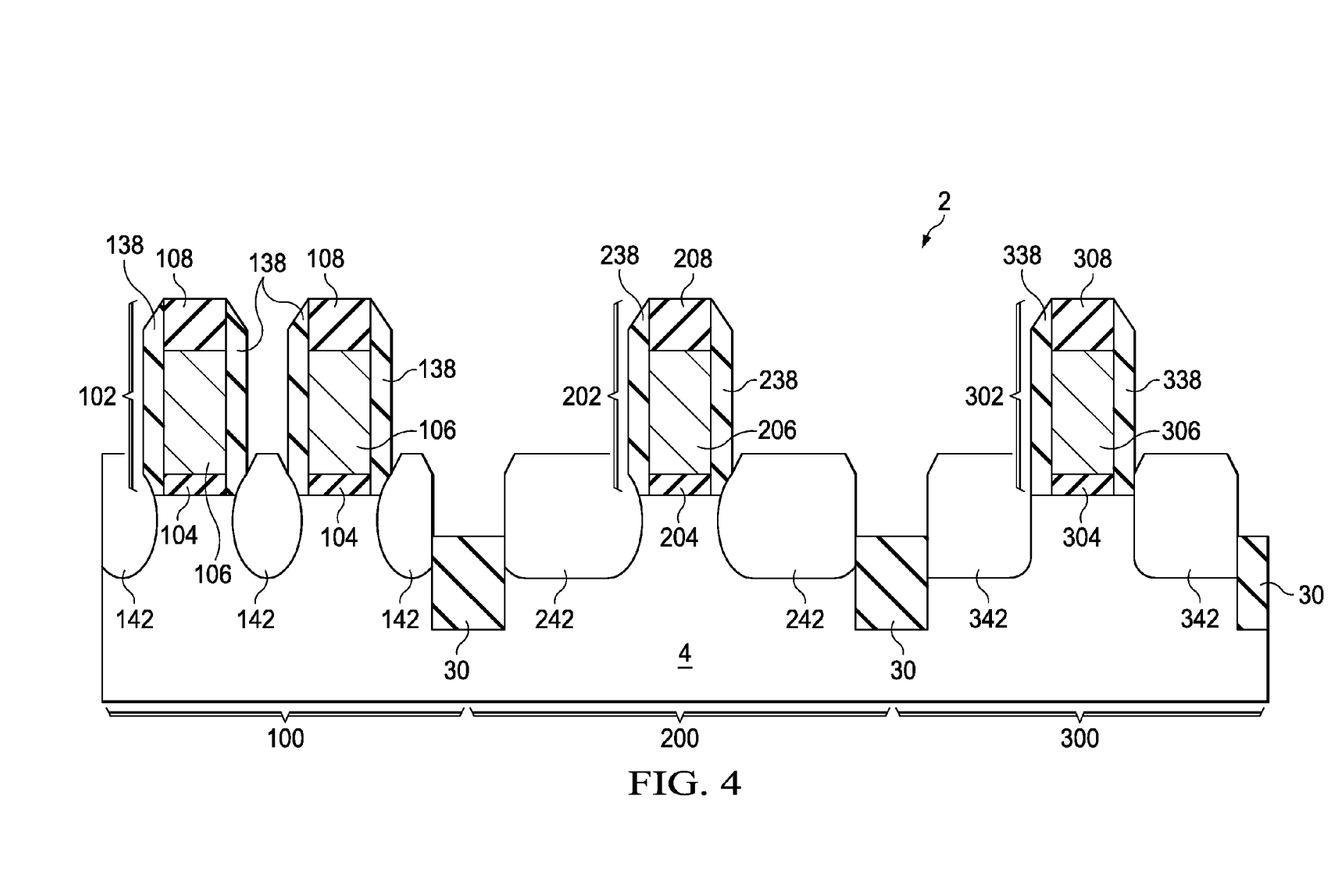

FIG. 4 illustrates the formation of epitaxy semiconductor regions 142, 242, and 342 in openings 136, 236, and 336, respectively. Before the epitaxy, a pre-clean may be performed, for example, using an HF-based gas or a SiCoNi-based gas. The pre-clean may remove any undesirable silicon oxide that is formed as a result of the nature oxidation of the exposed surfaces in openings 136, 236, and 336. Epitaxy regions 142, 242, and 342 may be silicon germanium regions, III-V compound semiconductors, silicon phosphorous regions, silicon carbon regions, or the like. Although FIG. 4 illustrates that epitaxy semiconductor regions 142, 242, and 342 are grown simultaneously, they can also be grown in separate epitaxy processes, and may comprise different materials. Epitaxy semiconductor regions 142, 242, and 342 may be in-situ doped with a p-type or an n-type impurity during their growth, and hence the resulting transistors 160, 260, and 360 (FIG. 6) may be p-type or n-type transistors. Epitaxy semiconductor regions 142, 242, and 342 in these embodiments are also source/drain regions. In alternative embodiments, after the epitaxy, epitaxy semiconductor regions 142, 242, and 342 are implanted with p-type or n-type impurities to form transistors.

Figure 5:
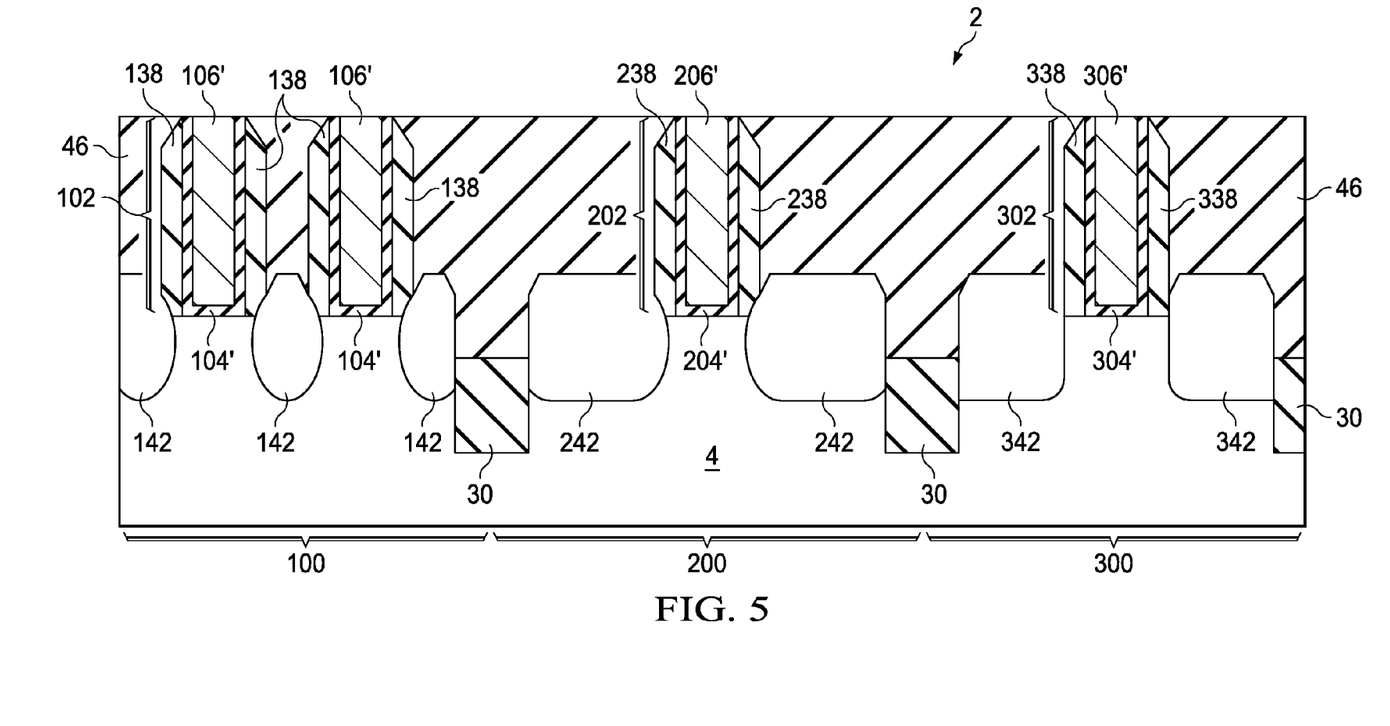
Figure 8:
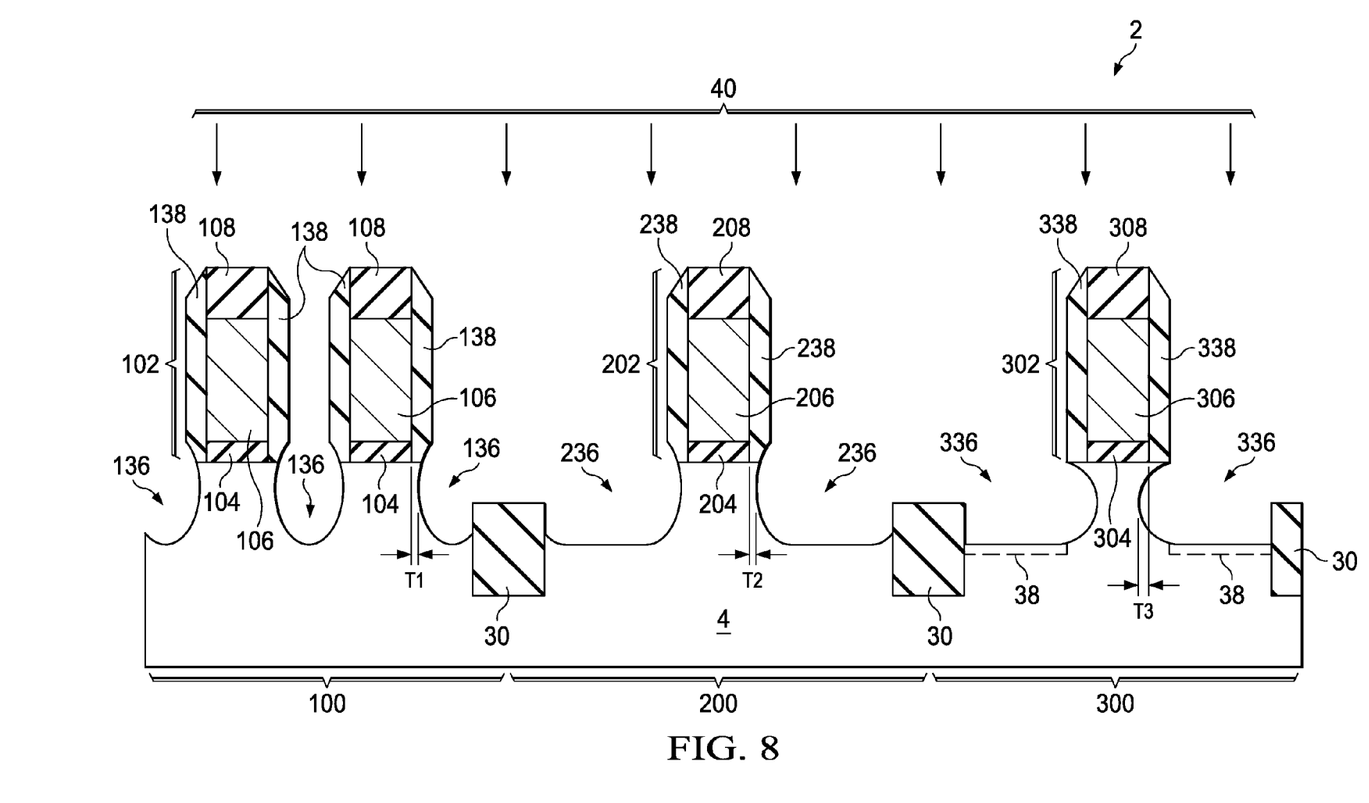

Next, hard masks 108, 208, and 308, if any, are removed, and replacement gates are formed to replace gate dielectrics 104, 204, and 304 and gate electrodes 106, 206, and 306 in accordance with some embodiments, as shown in FIG. 8. In alternative embodiments, gate dielectrics 104, 204, and 304 and gate electrodes 106, 206, and 306 (FIG. 4) are not replaced with replacement gates. In the embodiments in which replacement gates are formed, gate dielectrics 104, 204, and 304 and gate electrodes 106, 206, and 306 act as dummy gates. FIG. 5 illustrates an exemplary structure including the replacement gates. The formation process may include forming Inter-Layer Dielectric (ILD) 46, performing a CMP to level the top surfaces of ILD 46 with the top surface of gate stacks 102, 202, and 302, and removing gate stacks 102, 202, and 302. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectrics 104', 204', and 304' and gate electrodes 106', 206', and 306'. Gate dielectrics 104', 204', and 304' may comprise a high-k dielectric material having a k value greater than about 7.0, for example, and gate electrodes 106', 206', and 306' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like.

Figure 6:
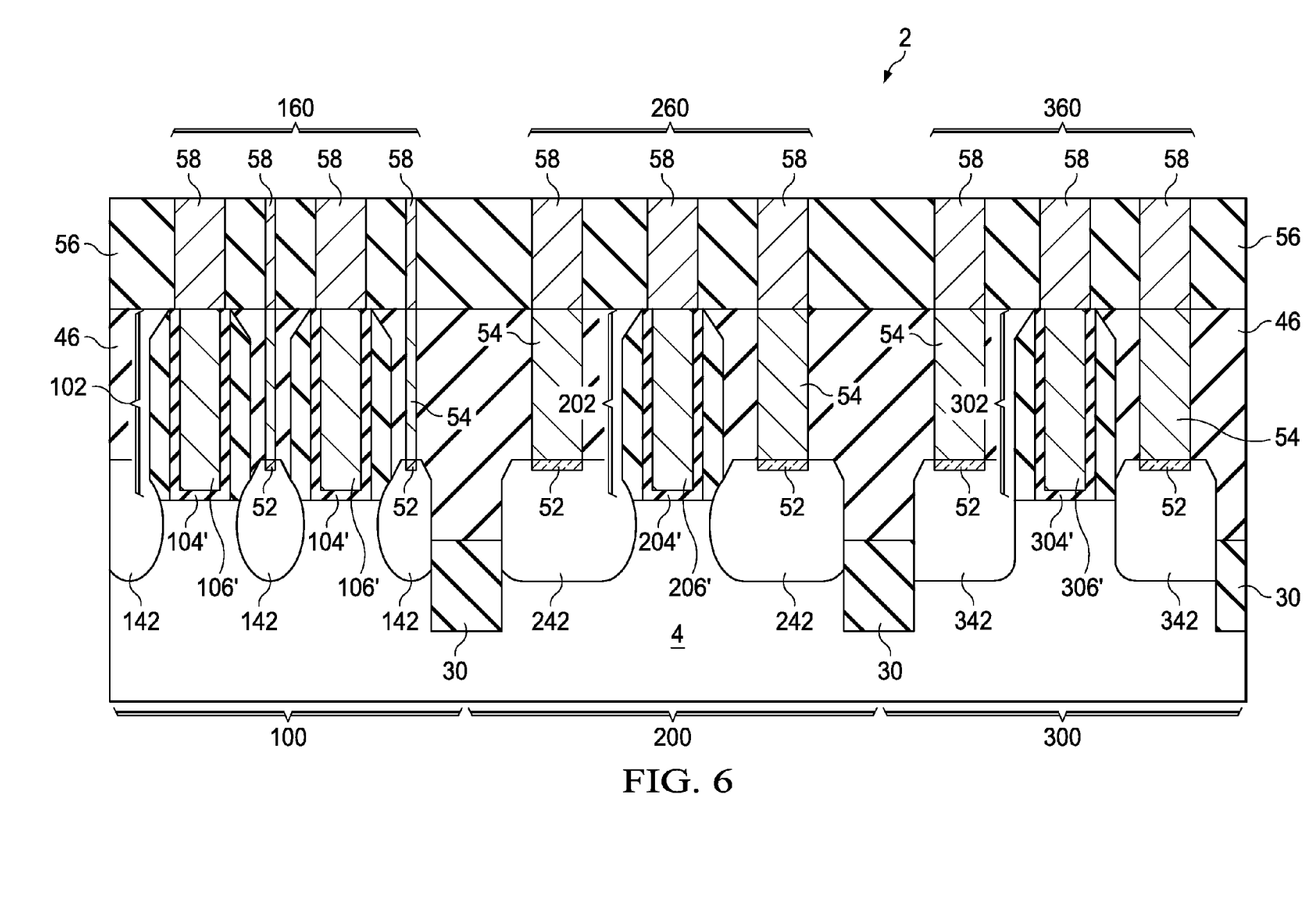

FIG. 6 illustrates the formation of source/drain silicide regions 52 and contact plugs 54. Contact openings (occupied by contact plugs 54) are formed in ILD 46, exposing the underlying epitaxy regions 142, 242, and 342. Silicide regions 52 may be formed by blanket depositing a thin metal layer (not shown) comprising a metal such as titanium, cobalt, nickel, tungsten, or the like, which thin metal layer extends into the contact openings. Wafer 2 is then heated, which causes the silicide reaction to occur wherever the metal is in contact with silicon. As a result of the reaction, a layer of metal silicide is formed between epitaxy regions 142/242/342 and the metal. The un-reacted metal is selectively removed through the use of an etchant that attacks metal but does not attack silicide.

Contact plugs 54 are then formed by filling a conductive material such as tungsten, copper, aluminum, titanium, cobalt, silicon, germanium, and/or the like, into the contact openings, and performing a CMP to level the top surface of contact plugs 54 with the top surface of ILD 46. An additional ILD 56 and contact plugs 58 are then formed. The formation of MOS transistors 160, 260, and 360 in device regions 100, 200, and 300 is thus finished.

FIGS. 7 through 10 illustrate the cross-sectional views of intermediate stages in the formation of transistors in accordance with alternative embodiments. These embodiments are similar to the embodiments in FIGS. 1 through 6, except that the etch-retarding element is replaced with an etch-enhancing element, which may accelerate, rather than retard, the etching of substrate 4. Throughout the description, the etch-retarding element and the etch-enhancing element are in combination referred to as etch-tuning elements. Unless specified otherwise, the materials and the formation methods of the components in these embodiments are essentially the same as the like components, which are denoted by like reference numerals in the embodiments shown in FIGS. 1 through 6. The details regarding the formation process and the materials of the components shown in FIGS. 7 through 10 may thus be found in the discussion of the embodiment shown in FIGS. 1 through 6.

Figure 7:
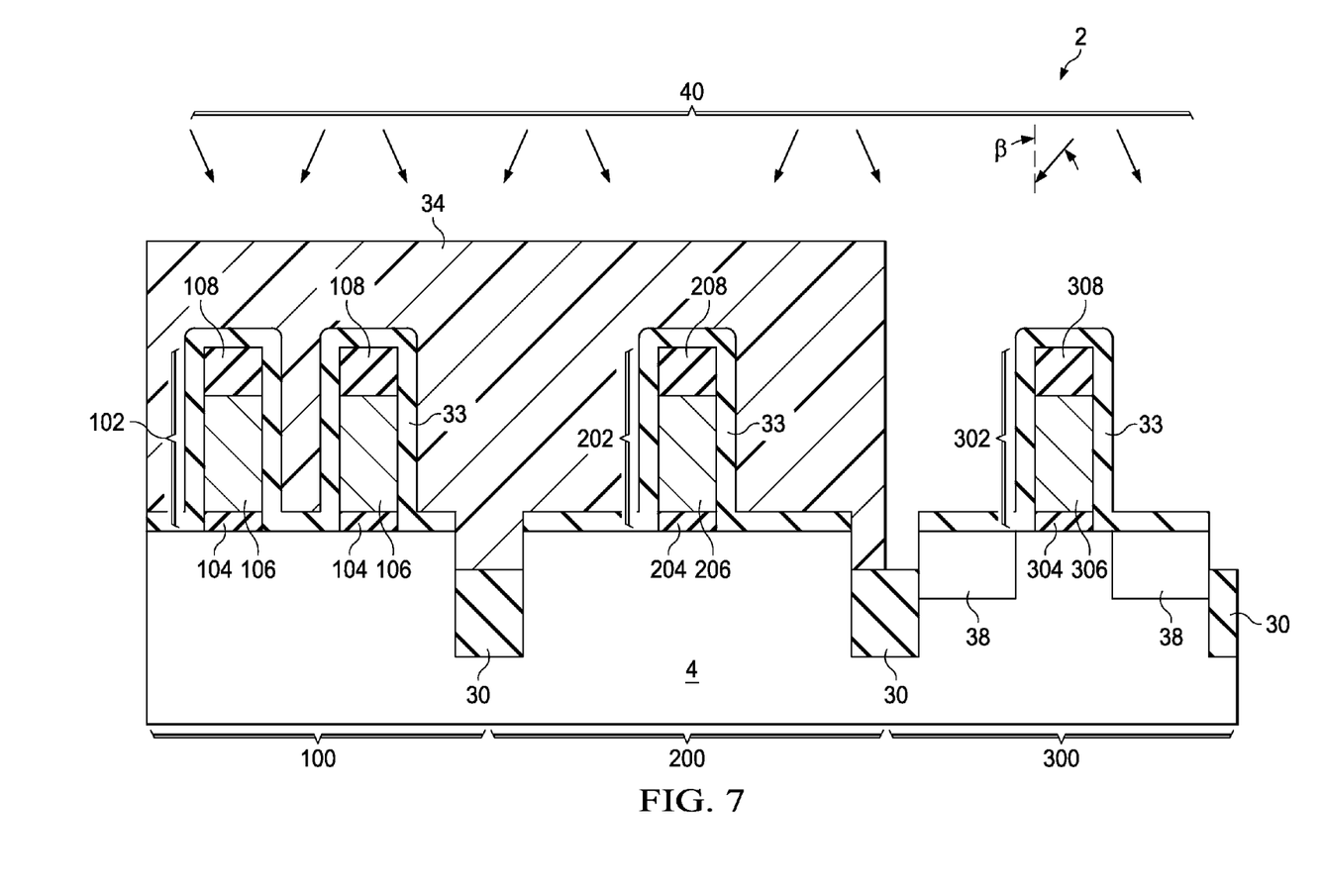
FIGS. 7 through 10 are cross-sectional views of intermediate stages in the manufacturing of transistors whose source/drain stressors have different trench profiles in accordance with alternative exemplary embodiments.

The initial steps of these embodiments are essentially the same as shown in FIG. 1. Next, as shown in FIG. 7, photo resist 34 is formed to cover device regions 100 and 200, with device region 300 not covered. Etch-enhancing regions 38' are formed by implantations 36. In some exemplary embodiments, the implanted etch-enhancing element comprises arsenic, phosphorous, or combinations thereof. The implantations may be performed with tilt angle θ that is greater than about 20 degrees. Tilt angle θ may also be between about 30 degrees and about 60 degrees. Hence, etch-enhancing regions 38' extend below the vertical portions of gate spacer layer 33. In some embodiments, etch-enhancing regions 38' have edges aligned with edges of gate electrode 206. In alternative embodiments, portions of etch-enhancing regions 38' are overlapped by the edge portions of gate stack 302, as illustrated. Photo resist 34 is removed.

Next, as shown in FIG. 8, etching 40 is performed to form openings 136, 236, and 336. Since the etch-enhancing element results in the respective semiconductor substrate 4 to be etched faster than the un-doped portions of substrate 4 that are not doped with the etch-enhancing element, the lateral etching is more significant in device region 300 than in device regions 100 and 200. As a result, openings 336 extend more toward gate electrode 306 than openings 236 (or 136) extend toward gate electrode 206 (or 106). Alternatively stated, gate proximities T1 and T2 are smaller than gate proximity T3. In some embodiments, gate proximity T3 is zero nm, meaning that the edges of openings 336 are aligned with the edges of gate stack 302. In alternative embodiments, portions of openings 336 are overlapped by the edge portions of gate stack 302, as illustrated, which means that gate proximity T3 is negative. In some embodiments, as a result of the formation of openings 336, etch-enhancing regions 38' are essentially removed, and hence substantially no etch-enhancing element is left in device region 300. In alternative embodiments, after the formation of openings 336, there are some residue parts of etch-enhancing element left at the bottoms and/or the sidewalls of trenches 336, as illustrated by dashed lines.

Figure 9:
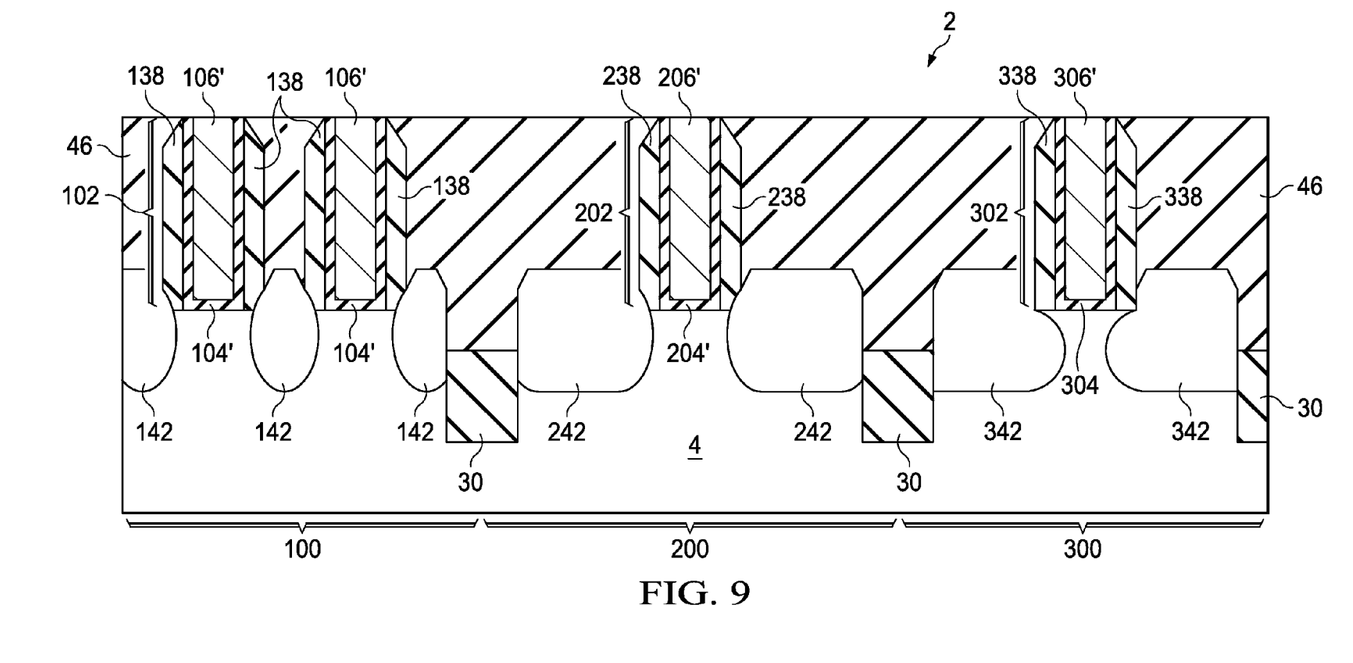
Figure 10:
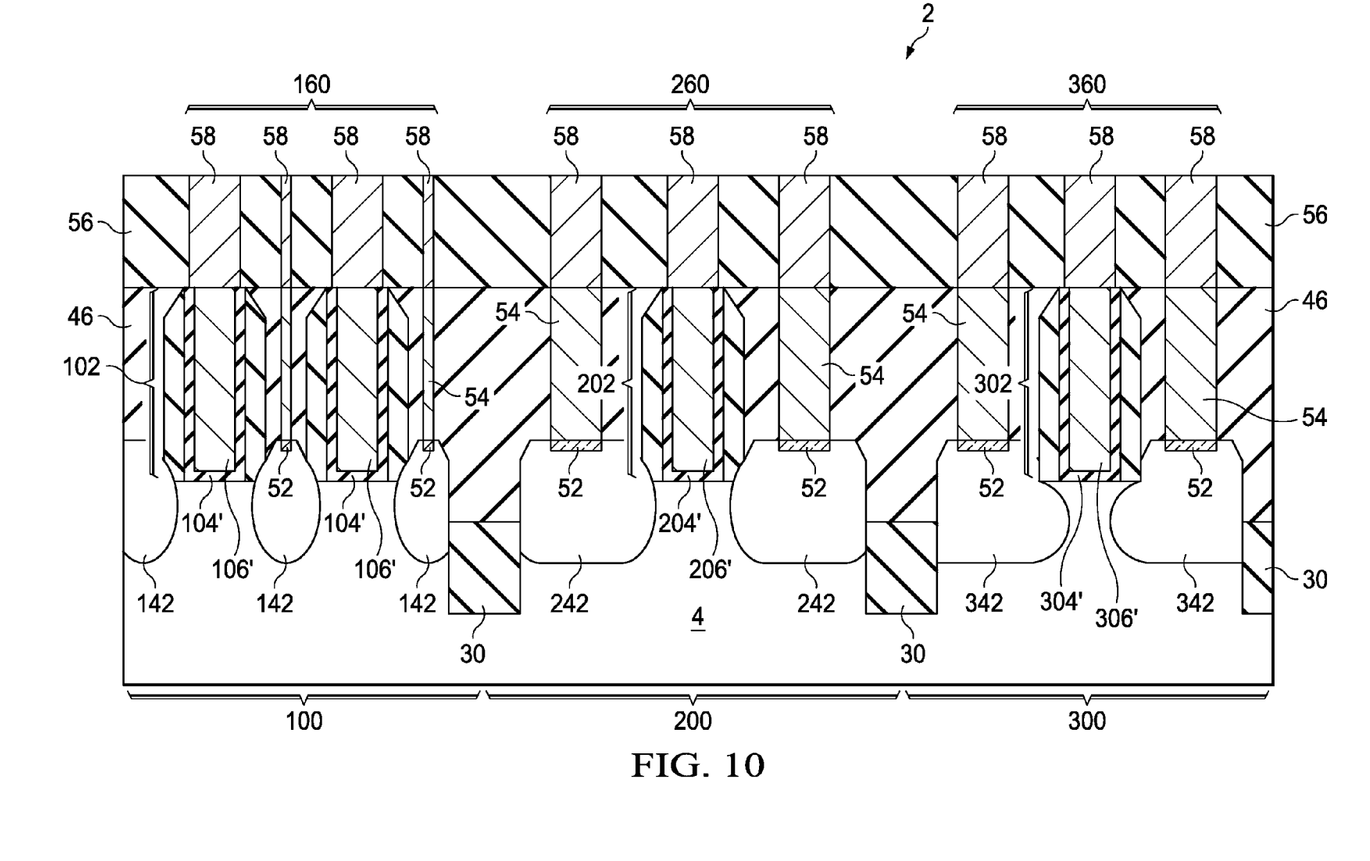

FIG. 9 illustrates the formation of epitaxy semiconductor regions 142, 242, and 342. FIG. 10 illustrates the formation of silicide regions 52, ILD 46, the replacement gates, and contact plugs 54. The details have been discussed referring to FIGS. 5 and 6, and are not repeated herein. Again, in these embodiments, each of the resulting transistors 160, 260, and 360 may be a p-type transistor or an n-type transistor.

The embodiments of the present disclosure have some advantages features. By doping some active regions with the etch-tuning elements, with some other active regions not doped with the etch-tuning elements, source/drain openings having different profiles may be formed simultaneously in a same etching process, even if the openings have the same densities and/or widths. The manufacturing cost is hence saved.

In accordance with some embodiments, a method includes forming a first gate stack and a second gate stack over a first portion and a second portion, respectively, of a semiconductor substrate, masking the first portion of the semiconductor substrate, and with the first portion of the semiconductor substrate being masked, implanting the second portion of the semiconductor substrate with an etch-tuning element. The first portion and the second portion of the semiconductor substrate are etched simultaneously to form a first opening and a second opening, respectively, in the semiconductor substrate. The method further includes epitaxially growing a first semiconductor region in the first opening, and epitaxially growing a second semiconductor region in the second opening.

In accordance with other embodiments, a method includes forming a first gate stack and a second gate stack over a first portion and a second portion, respectively, of a semiconductor substrate, and implanting the second portion of the semiconductor substrate with an etch-tuning element to form an implanted region. The first portion of the semiconductor substrate is covered during the implanting. The method further includes simultaneously etching the first portion and the second portion of the semiconductor substrate to form a first opening and a second opening, respectively, in the semiconductor substrate, wherein substantially an entirety of the implanted region is removed by the etching. A first source/drain region and a second source/drain region are simultaneously grown in the first opening and the second opening, respectively.

In accordance with yet other embodiments, a method includes forming a first gate stack and a second gate stack over a first portion and a second portion, respectively, of a semiconductor substrate, and implanting the second portion of the semiconductor substrate with an etch-tuning element to form an implanted region. The first portion of the semiconductor substrate is covered during the implantation. The first portion and the implanted region of the semiconductor substrate are etched simultaneously to form a first opening and a second opening, respectively, in the semiconductor substrate. The implanted region has a lower lateral etching rate than the first portion of the semiconductor substrate. A first source/drain region and a second source/drain region are simultaneously grown in the first opening and the second opening, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a first gate stack and a second gate stack over a first portion and a second portion, respectively, of a semiconductor substrate;
masking the first portion of the semiconductor substrate;
with the first portion of the semiconductor substrate being masked, implanting the second portion of the semiconductor substrate with an etch-tuning element;
simultaneously etching the first portion and the second portion of the semiconductor substrate to form a first opening and a second opening, respectively, in the semiconductor substrate, a first surface of the first opening proximate the first gate stack being a curved surface with more than one crystallographic plane, a second surface of the second opening proximate the second gate stack being a curved surface with more than one crystallographic plane, wherein during the simultaneously etching, portions of the semiconductor substrate implanted with the etch-tuning element have a higher lateral etching rate than portions of the semiconductor substrate un-implanted with the etch-tuning element, and the portions of the semiconductor substrate implanted with the etch-tuning element and the portions of the semiconductor substrate un-implanted with the etch-tuning element having a same vertical etching rate;
epitaxially growing a first semiconductor region in the first opening; and
epitaxially growing a second semiconductor region in the second opening.

2. The method of claim 1, wherein after the etching the first portion and the second portion of the semiconductor substrate, the etch-tuning element is removed from the semiconductor substrate substantially fully.

3. The method of claim 1, wherein after the etching the first portion and the second portion of the semiconductor substrate, the etch-tuning element includes residues remaining in a layer of the semiconductor substrate, and wherein the layer of the semiconductor substrate is overlapped by the second opening.

4. The method of claim 1, wherein the etch-tuning element is selected from the group consisting essentially of phosphorous, arsenic, and combinations thereof.

5. The method of claim 1, wherein a first gate proximity of the first opening is smaller than a second gate proximity of the second opening.

6. The method of claim 1, wherein a first gate proximity of the first opening is greater than a second gate proximity of the second opening.

7. The method of claim 1, wherein after the etching, the etch-tuning element includes residue portions remaining in a portion of the semiconductor substrate, and the portion of the semiconductor substrate is overlapped by the second opening.

8. A method comprising:
forming a first gate stack and a second gate stack over a first portion and a second portion, respectively, of a semiconductor substrate;
implanting the second portion of the semiconductor substrate with an etch-tuning element to form an implanted region, wherein the first portion of the semiconductor substrate is covered during the implanting;
simultaneously etching the first portion and the second portion of the semiconductor substrate to form a first opening and a second opening, respectively, in the semiconductor substrate, a surface of at least one of the first opening or the second opening proximate to the first gate stack or the second gate stack, respectively, is a curved surface with more than one crystallographic plane, wherein during the simultaneously etching, the first portion of the semiconductor substrate has a first anisotropic etch rate and a first isotropic etch rate, and the second portion of the semiconductor substrate has a second anisotropic etch rate and a second isotropic etch rate, the first anisotropic etch rate and the second anisotropic etch rate being equal, the first isotropic etch rate and the second isotropic etch rate being unequal, the first anisotropic etch rate and the second anisotropic etch rate being greater than the first isotropic etch rate and the second isotropic etch rate, wherein substantially an entirety of the implanted region is removed by the etching, and a first gate proximity of the first opening is different from a second gate proximity of the second opening, with the first gate proximity being a lateral distance from the first opening to a closest edge of the first gate stack, and the second gate proximity being an additional lateral distance from the second opening to a closest edge of the second gate stack; and
simultaneously growing a first source/drain region and a second source/drain region in the first opening and the second opening, respectively.

9. The method of claim 8, wherein during the period of time between the implanted region is formed and the first portion and the second portion of the semiconductor substrate are etched, no thermal process is performed.

10. The method of claim 8, wherein during the simultaneously etching, the second isotropic etch rate is lower than the first isotropic etch rate.

11. The method of claim 8, wherein during the simultaneously etching, the second isotropic etch rate is higher than the first isotropic etch rate.

12. The method of claim 8, wherein a first gate proximity of the first opening is smaller than a second gate proximity of the second opening.

13. The method of claim 8, wherein a first gate proximity of the first opening is greater than a second gate proximity of the second opening.

14. The method of claim 8, wherein after the etching, the etch-tuning element includes residue portions remaining in a portion of the semiconductor substrate, and the portion of the semiconductor substrate is overlapped by the second opening.

15. A method comprising:
forming a first gate stack and a second gate stack over a first portion and a second portion, respectively, of a semiconductor substrate;
implanting the second portion of the semiconductor substrate with an etch-tuning element to form an implanted region, wherein the first portion of the semiconductor substrate is covered during the implanting;
simultaneously etching the first portion and the implanted region of the semiconductor substrate to form a first opening and a second opening, respectively, in the semiconductor substrate, a surface of at least one of the first opening or the second opening proximate to the first gate stack or the second gate stack, respectively, is a curved surface with more than one crystallographic plane, wherein during the simultaneously etching, the implanted region has a lower lateral etching rate than the first portion of the semiconductor substrate, and the implanted region and the first portion of the semiconductor substrate have equal vertical etching rates, wherein after the etching, the etch-tuning element includes residue portions remaining in a layer of the semiconductor substrate, and the layer of the semiconductor substrate is overlapped by the second opening; and
simultaneously growing a first source/drain region and a second source/drain region in the first opening and the second opening, respectively.

16. The method of claim 15, wherein the etch-tuning element comprises boron.

17. The method of claim 15, wherein the second gate stack and the second source/drain region are comprised in a p-type transistor.

18. The method of claim 15, wherein the second gate stack and the second source/drain region are comprised in an n-type transistor.

19. The method of claim 15, wherein the second gate stack and the second source/drain region are comprised in a Fin Field-Effect Transistor (FinFET).

20. The method of claim 15, wherein after the etching, the etch-tuning element is substantially fully removed from the semiconductor substrate.

* * * * *